United States Patent
Heinz et al.

(10) Patent No.: US 6,452,308 B1
(45) Date of Patent: Sep. 17, 2002

(54) PIEZOELECTRIC ACTUATOR

(75) Inventors: Rudolf Heinz, Renningen; Klaus-Peter Schmoll, Lehrensteinsfeld, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/601,353
(22) PCT Filed: Nov. 5, 1999
(86) PCT No.: PCT/DE99/03532
§ 371 (c)(1),
(2), (4) Date: Aug. 25, 2000
(87) PCT Pub. No.: WO00/34701
PCT Pub. Date: Jun. 15, 2000

(30) Foreign Application Priority Data

Dec. 5, 1998 (DE) .......................... 198 56 185

(51) Int. Cl.$^7$ .............................................. H01L 41/08
(52) U.S. Cl. ........................................ 310/328; 310/346
(58) Field of Search .................................. 310/328, 346

(56) References Cited

U.S. PATENT DOCUMENTS 4,011,474 A * 3/1977 O'Neill ....................... 310/328
4,553,059 A * 11/1985 Abe et al. ..................... 310/328

FOREIGN PATENT DOCUMENTS

DE 196 50 900 A1 * 6/1998

* cited by examiner

Primary Examiner—Brian Sircus
Assistant Examiner—Michael C. Zarroli
(74) Attorney, Agent, or Firm—Ronald E. Greigg

(57) ABSTRACT

A piezoelectric actuator for actuating control valves or injection valves in internal combustion engines in motor vehicles. The piezoelectric actuator body is in the form of a multilayer laminate of layered plies of piezoelectric material and intervening metal, for instance electrically conductive layers acting as electrodes. The electrode layers are contacted by electrically conductive common electrode leads, and the actuator body is surrounded by a metal module wall which encircles an interstice that contains the common electrode leads. The common electrode leads are designed in the form of a three-dimensionally structured surface or a three-dimensionally structured body, and a portion thereof contacting the actuator body has a lengthened portion or enlargement, that protrudes into the interstice, for dissipating heat from the actuator body, and an elastomer filling with heat-conducting additive particles in the interstice.

18 Claims, 4 Drawing Sheets

PIEZOELECTRIC ACTUATOR

BACKGROUND OF THE INVENTION

The invention is directed to improvements in piezoelectric actuators, in particular for actuating control valves or injection valves in internal combustion engines in motor vehicles, having a piezoelectric actuator body, in particular in the form of a multilayer laminate comprised of layered plies of piezoelectric material and intervening metal or electrically conductive layers acting as electrodes, these electrode layers being contacted by electrically conductive common electrode leads, and the actuator body is surrounded by a metal module wall while maintaining an interstice that contains the common electrode leads.

One such piezoelectric actuator is disclosed for instance in German Patent Disclosure DE 196 50 900 A1 of Robert Bosch GmbH.

As is well known, piezoelectric actuators can for instance be used for injection valves of a vehicle motor and in brake systems with anti-lock and traction control systems.

Such injection valves equipped with piezoelectric actuators have an injection nozzle controlled by a tappetlike closure device. An operative face toward the nozzle is disposed on the tappet and is acted upon by the pressure of the fuel supplied to the nozzle; the pressure forces seek to urge the tappet in the opening direction of the closure device. The tappet protrudes with a plungerlike end, whose cross section is larger than the aforementioned operative face, into a control chamber. The pressure effective there seeks to urge the tappet in the closing direction of the closure device. The control chamber communicates with the fuel supply, which is at a high pressure, via an inlet throttle and with a fuel return line that has only low pressure, via an outlet valve that is throttled as a rule or is combined with an outlet throttle. When the outlet valve is closed, a high pressure prevails in the control chamber, by which the tappet is moved in the closing direction of the closure device, counter to the pressure on its operative face toward the nozzle, or is kept in the closing position. Upon opening of the outlet valve, the pressure in the control chamber drops; the magnitude of the drop in pressure is determined by the size of the inlet throttle and by the throttle resistance of the opened outlet valve, or the outlet throttle combined with it. As a result, the pressure in the control chamber decreases when the outlet valve is opened, in such a way that the tappet is moved in the opening direction of the closure device, or held in the open position, by the pressure forces that are operative on its operative face toward the nozzle.

In comparison with electromagnetically actuated injection valves, piezoelectric actuators can switch faster. However, in the design of a piezoelectric actuator, it must be noted that internal losses in the piezoelectric body of the actuator cause lost heat, which has to be dissipated so that the actuator will not overheat. Since the ceramic materials of the piezoelectric ceramic have poorer heat conductivity, the dissipation inside the actuator body, which substantially comprises ceramic material, is unfavorable, especially in long actuators, whose length is greater than their width.

Because of the electrodes that are located in the active part of the actuator body, its heat conductivity crosswise to the electrode layers is higher by a factor of three to five than at right angles to this, since the piezoelectric ceramic material is a poor heat conductor. Naturally, this factor depends on the geometric conditions, such as the thickness of the ceramic layers and the thickness of the electrode layers from the edge of the actuator body. Since as noted the heat conduction perpendicular to the electrode layers is poor, the heat takes the course through the electrodes of the active part of the actuator body to the common electrode leads located on the outside. Since these common electrode leads on the outside must not have any contact with the metal actuator base or the metal retaining plate in the region of the actuator head, the heat that occurs in the actuator body cannot be dissipated to these metal bodies unless further provisions are made. In particular, because of the high voltage, about 200 V, at the common electrode leads, special provisions are required for insulating the common electrode leads from the metal parts of the actuator module.

Cooling the actuator with a liquid coolant, such as fuel, water, motor oil and the like, which is theoretically possible, is unfavorable, first because of the risk of a short circuit from the water component that is contained both in the fuel and in motor oil, and second because the actuator module is more expensive because of complicated seals, which must preclude the coolant used from escaping from the actuator module, especially when the actuator becomes heated.

OBJECTS OF THE INVENTION

It is therefore the principal object of the invention to make a piezoelectric actuator in such a way that reliable cooling of the actuator body that heats up during operation is possible without using liquid coolant. Another object of the invention is the piezoelectric actuator can be installed in a simple way and does not require any special seals as in the case of cooling with liquid.

SUMMARY OF THE INVENTION

In an essential aspect of the invention, this object is attained in that the common electrode leads are designed in the form of a three-dimensionally structured surface or a three-dimensionally structured body i.e., the shape of the common electrode leads are not in a form of a conventional wire as usually used for electrodes, and the portion thereof contacting the actuator body has a lengthened portion or enlargement, protruding into the interstice, for dissipating heat from the actuator body.

In one embodiment, the lengthened portions of the common electrode leads are designed in the form of corrugated bands or foils that are parallel to the side walls of the actuator body.

In a second exemplary embodiment, to create a larger heat-conducting surface area, the common electrode leads located on the outside are lengthened by providing that the electrode leads in the interstice between the actuator body and the module wall are folded once or multiple times.

In a variant of the second embodiment, if a corrugated band is used for the common electrode leads, then the cooling area can also be increased by the design of the height of the corrugations.

In still another embodiment the conduction onward of the heat, given up by the enlarged or lengthened common electrode leads, to the module wall is preferably effected by means of a heat-conducting elastomer that fills up the interstice and envelops the lengthened common electrode leads.

Yet another embodiment involves a further increase in the cooling action of the enlarged or lengthened common electrode leads is accomplished by using an elastomer with electrically conductive particles and a high fill factor. In this case, the inside of the module wall must be electrically insulated, for instance by means of a layer of paint or oxide.

In still another embodiment for enlarging the heat-dissipating surface area of the common electrode leads, a lengthening of the lead wires can also be considered. Once again, the wire length and thus the heat-yielding surface area of the lead wire can be increased by folding it inside the interstice between the actuator body and the module wall.

In yet a further embodiment a combination of a lengthening, of the common electrodes leads optionally folded multiple times, of the common electrode leads, each with a lengthened lead wire, is equally possible.

In another still more favorable embodiment, one can introduce metal segments into the interstice, which are then welded or soldered to the electrode leads that are lengthened on both ends. These metal segments are preferably of copper and are glued to the module wall, which is provided with an electric insulation layer.

In a variant of the last embodiment, it is more economical but not quite so effective to use a metal wool or mesh, which is introduced between the common electrode leads and the module wall that is electrically insulated on its inside, and which is saturated with an elastic adhesive or an elastomer for fixation purposes.

In all the exemplary embodiments mentioned above of the piezoelectric actuator of the invention, the interstice can advantageously be filled with an elastomer, mixed with heat-conductive particles.

A piezoelectric actuator designed with the above characteristics utilizes the common electrode leads, located on the outside, which for the sake of good heat dissipation have been lengthened or enlarged, to dissipate the heat from the actuator. Thus solely solid bodies are utilized for heat dissipation, and hence no leakage problems of the kind that sometimes occur if the actuator is liquid-cooled can arise. By sheathing the actuator body with an elastomer or the like, no risk of short-circuiting from splashing water or other dirt occurs.

The piezoelectric actuator according to the invention is especially suited for use in common rail diesel injector systems and for PDE injector systems. Gasoline direct injection valves can also advantageously be made with a piezoelectric actuator of this kind.

The above and additional objects and advantages of the invention will be described in further detail below in conjunction with the drawings, which show several exemplary embodiments.

DRAWINGS

FIG. 1A schematically and in longitudinal section shows one basic exemplary embodiment of a piezoelectric actuator according to the invention;

EXEMPLARY EMBODIMENTS

Figure 1A:
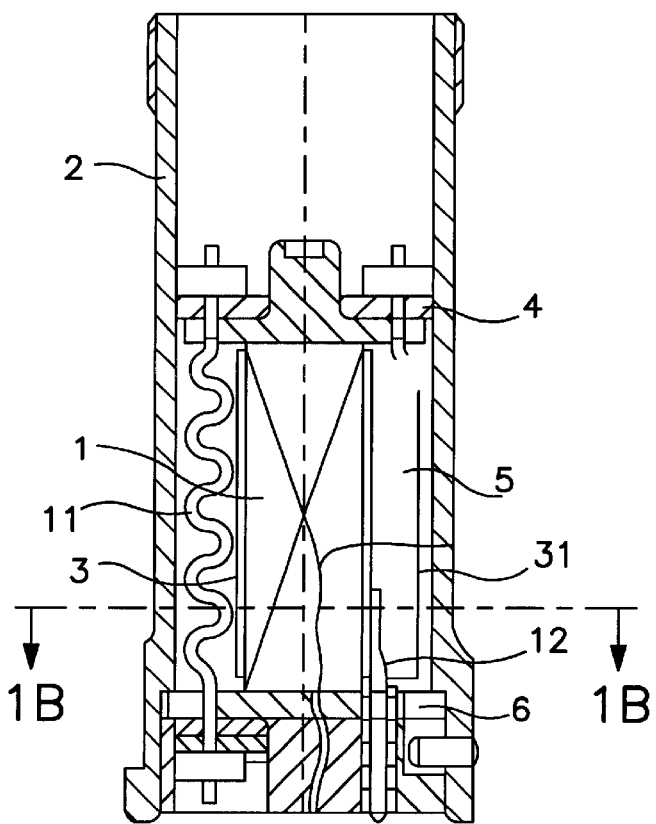
FIG. 1B shows a further basic exemplary embodiment of a piezoelectric actuator of the invention in cross section.

In the first exemplary embodiment, shown in fragmentary longitudinal section in FIG. 1A, of a piezoelectric actuator of the invention, an actuator body 1, which can take the form of a multilayer laminate of stacked layers of piezoelectric material and metal or electrically conductive layers between them and acting as electrodes, is elastically prestressed with its face ends on the left and right by two spring bands (not shown) between a lower metal actuator base 6 and an upper, axially movable plate 4 located on the actuator head and embodied as a partition. The actuator module is enclosed by a metal module wall 2. It should be noted that FIG. 1A shows only the left-hand spring band 11. The spring bands used for the prestressing can also be replaced by a compression spring that presses on the movable plate 4.

Figure 1B:
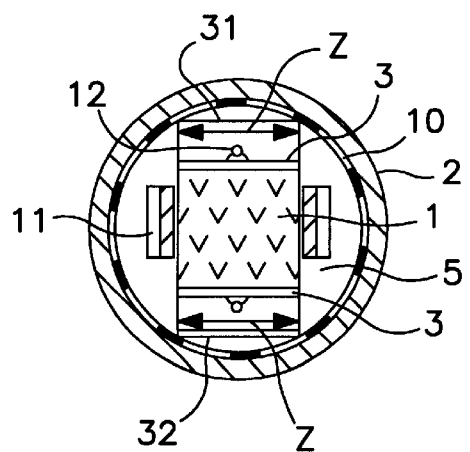

Located on both outer long sides of the actuator body 1 in FIG. 1B are common conductive electrode leads 3, which are each contacted with the individual electrode layers extended to the outside toward this long side. As noted, the heat produced in the actuator body 1 is conducted predominantly to its side faces. There, the heat is absorbed by the common electrode leads 3 and dissipated by their enlarged or lengthened part to the surroundings, in particular to the module wall 2. The lengthened portions 31, 32 of the common electrode leads 3 are U-shaped and protrude, parallel to the side walls of the actuator body 1, into the interstice 5 (for the sake of simplicity, only the lengthened electrode portion 31 on the right is shown). In the sectional view of FIG. 1B, the side faces of the actuator body 1 that are in contact with the common electrode leads 3 can be seen. Arrows Z indicate the electrode zones. An insulation layer 10 that electrically insulates the interior of the module wall 2 can also be seen; it assures that the lengthened portions 31, 32 of the common electrode leads 3 cannot cause any short circuit at the module wall 2. The spring bands 11 according to FIG. 1B rest along the side faces of the actuator body 1 but are not covered by the common conducting electrode leads 3 (unlike the situation in the simplified view of FIG. 1A).

It can be seen in FIG. 1B that both electrode leads 3 have lengthened portions 31, 32.

Figure 2:
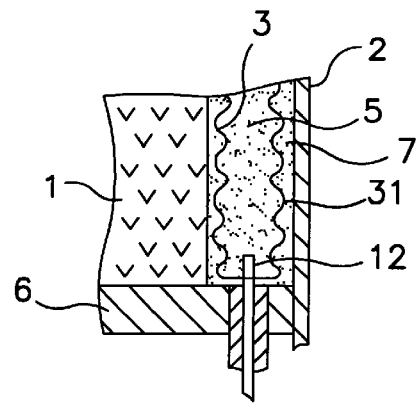
FIGS. 2–9 show different variants of a lengthened and/or enlarged common electrode lead, in each case in the form of a longitudinal section showing a cutout through a piezoelectric actuator according to the invention.

The variant shown in FIG. 2 differs from the version in FIG. 1 in that a corrugated metal band or a corrugated metal foil acts as the common electrode lead 3. In this case, the lengthened portion 31 of the common electrode lead 3 also comprises a corrugated metal band. The interstice 5 is furthermore filled with an elastomer 7 that is a good heat conductor and that absorbs the heat produced by the lengthened common electrode lead 3, 31 and in particular dissipates it to the metal module wall 2. To enhance the heat conductivity of the elastomer, it can be filled with heat-conducting fillers.

Figure 3:
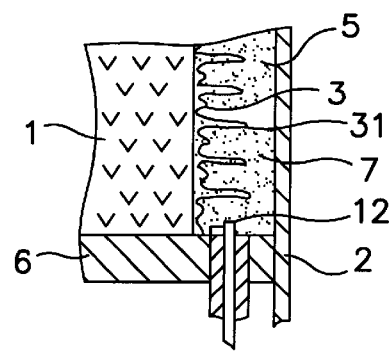

In the variant shown in FIG. 3, the common electrode lead 3 is lengthened by providing that at least some of the crests 31 of the corrugated band serving as a common electrode lead are higher, thus increasing the effective cooling surface area of the common electrode lead 3. In the variant shown in FIG. 3, the interstice 5 can also be filled with an elastomer 7 that is a good heat conductor, optionally with the addition of heat-conducting fillers.

Figure 4:
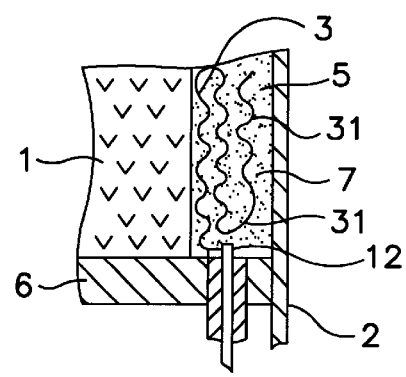

In the variant shown in FIG. 4, the lengthened portion 3 of the corrugated band acting as a common electrode lead 3 is folded multiple times inside the interstice 5, so that in comparison with FIG. 2, a markedly larger surface area that is effective for the heat dissipation is achieved.

Figure 5:
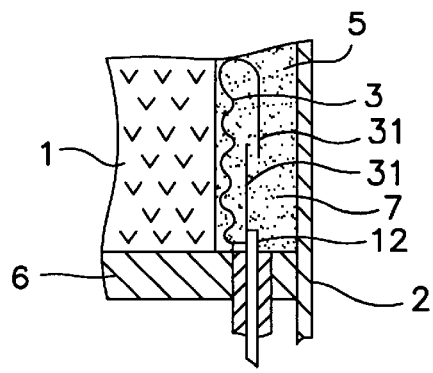

A different form of the folding of the common electrode lead 3 for increasing the effective surface area for heat dissipation is shown in FIG. 5. Here, the two bent-over end portions 31, protruding into the interstice 5, of the corrugated common electrode lead 3 are not corrugated but instead extend in a straight line.

Figure 6:
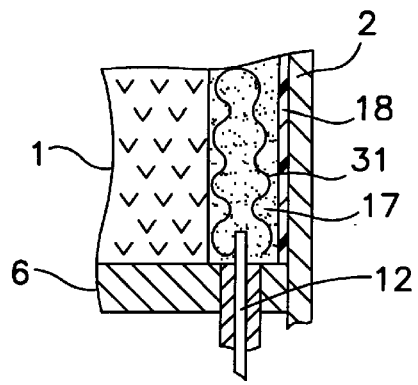

The variant shown in FIG. 6 has an electric insulation layer 18 on the inside of the module wall 2, in order to prevent the end portions of the common electrode lead 3, which may be folded multiple times and extend in corrugated fashion, from touching the module wall 2 and enabling the electrically conductive particles 17 added to the heat-conducting elastomer 7 from being able to cause a short circuit at the module wall 2. Furthermore, electrically if conductive filler material, such as the particles, cannot extend all the way around the actuator body 1, in order to prevent the risk of a short circuit at the two opposed electrodes 3, 31. In contrast to this, in all the variant versions with electrically insulating additive particles that are good heat conductors, the elastomer 7 can and should extend all the way around the actuator.

Figure 7A:
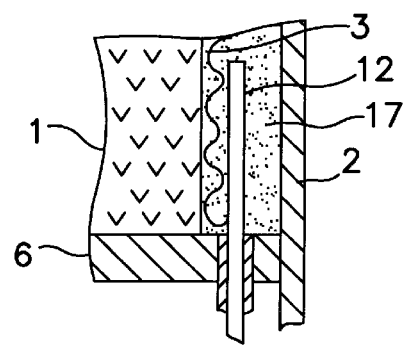
Figure 7B:
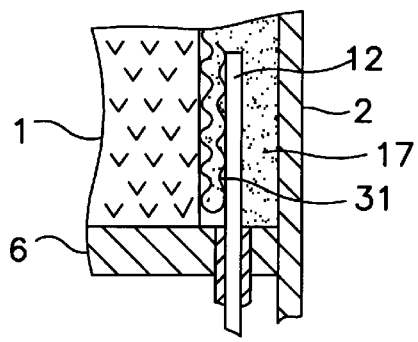

In the variant of the piezoelectric actuator of the invention shown in FIGS. 7A and 7B, the lead wire 12 is lengthened into the interstice 5 and forms a lengthened portion of the common electrode lead 3 for improving heat dissipation. The wire length of the lead wire 12 can be increased still further by folding it inside the interstice 5.

The variant of FIG. 7B includes a combination of a lengthened corrugated band 3 with a lead wire 12 lengthened as in FIG. 7A. The lengthened portion of the common electrode lead 3 is contacted at several points with the lengthened lead wire 12.

Figure 8:
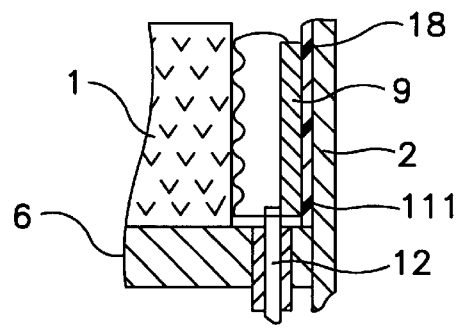

The variant shown in FIG. 8 is even more favorable, in which metal segments 9, preferably of copper, are introduced into the interstice 5. A corrugated band acting as a common electrode lead 3 is soldered or welded to the metal segment 9 on both sides. The module wall 2 is provided with an electric insulation layer 18, and the metal segment 9 is glued to the insulation layer 18 with an adhesive 111.

Figure 9:
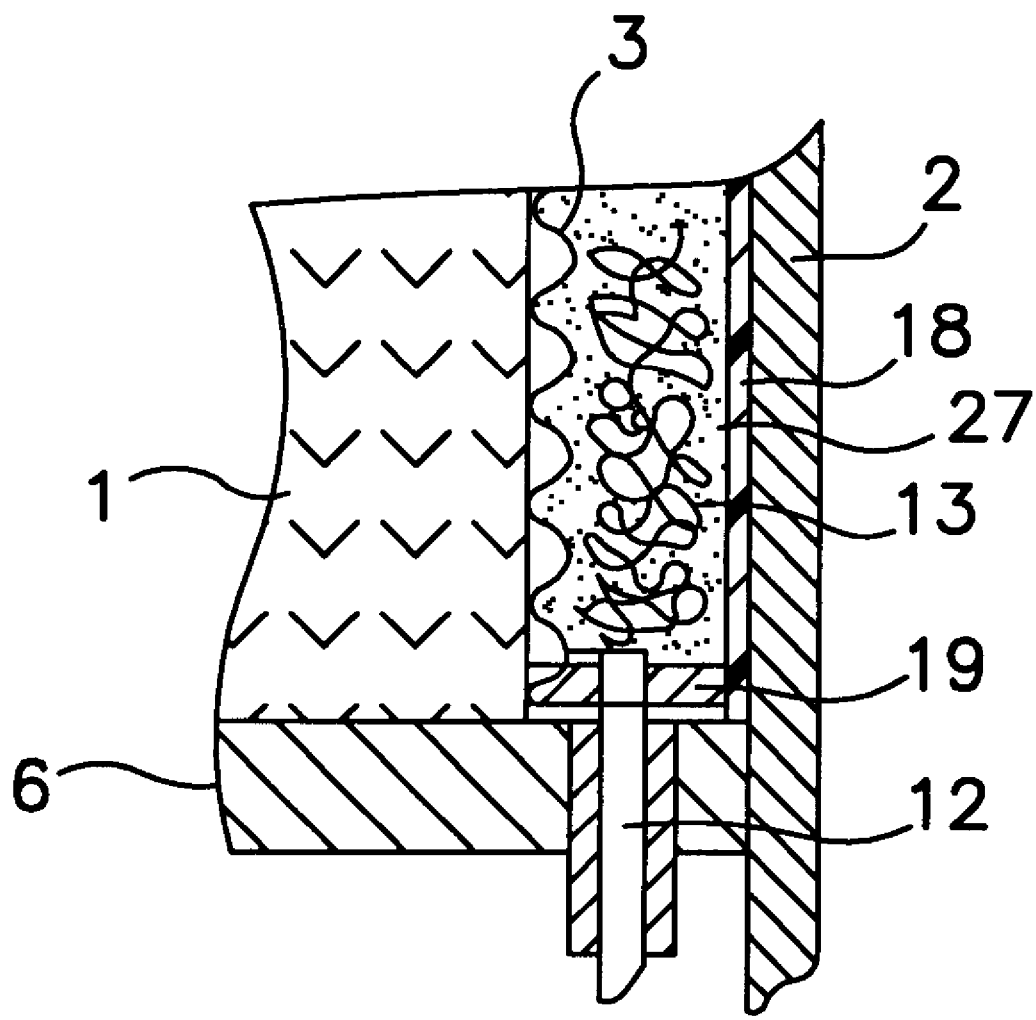

The variant shown in FIG. 9 is less expensive but not quite so effective; in it, a metal wool or mesh 13 is introduced between the corrugated band 3, which acts as a common electrode lead and the inside of the module wall 2 that is electrically insulated by an insulation layer 18, and for the sake of fixation this wool or mesh is saturated with an elastic adhesive or elastomer 27. The actuator base 6 is electrically insulated from the metal wool or mesh 13 by an elastomer plastic disk or a ceramic disk 19.

As already noted, the provisions shown in FIGS. 2-9 for lengthening or enlarging the common electrode lead can also be combined. In addition, the elastomer, filled with highly heat-conductive powder or particles, can already by itself improve the heat dissipation markedly and serve as a solution.

The foregoing relates to a preferred exemplary embodiments of the invention, it being understood that other variants and embodiments thereof are possible within the spirit and scope of the invention, the latter being defined by the appended claims.

We claim:

1. A piezoelectric actuator for actuating control valves or injection valves in internal combustion engines in motor vehicles,
   having a piezoelectric actuator body (1), comprised of a multilayer laminate of layered plies of piezoelectric material including means for applying an electric field to said plies of piezoelectric material, and
   conductive common electrode leads (3), which connect to the means for supplying an electric field, wherein
   the actuator body (1) is surrounded by a metal module wall (2),
   an interstice (5) is provided between said module wall and said common electrode leads,
   the common electrode leads (3) are configured to increase heat transfer thereof and a portion of said common electrode leads contact the actuator body (1) and is provided as means for increasing a surface area thereof protruding into the interstice (5), for dissipating heat from the actuator body (1), and
   the interstice (5) is filled with elastomer (7, 17, 27), which contains heat-conducting means, and in which said means for increasing a surface area of said leads comprises a lengthened portion (31, 32) of said leads.

2. The piezoelectric actuator of claim 1, in which said means configuring said electrode leads comprises a three dimensional structure body.

3. The piezoelectric actuator of claim 2, in which said means configuring said electrode leads comprises a three dimensional structure surface.

4. A piezoelectric actuator for actuating control valves or injection valves in internal combustion engines in motor vehicles,
   having a piezoelectric actuator body (1), comprised of a multilayer laminate of layered plies of piezoelectric material including means for applying an electric field to said plies of piezoelectric material, and
   conductive common electrode leads (3), which connect to the means for supplying an electric field, wherein
   the actuator body (1) is surrounded by a metal module wall (2),
   an interstice (5) is provided between said module wall and said common electrode leads,
   the common electrode leads (3) are configured to increase heat transfer thereof and a portion of said common electrode leads contact the actuator body (1) and is provided as means for increasing a surface area thereof protruding into the interstice (5), for dissipating heat from the actuator body (1), and
   the interstice (5) is filled with elastomer (7, 17, 27), which contains heat-conducting means, and in which said means for increasing a surface area of said leads comprises an enlargement of a portion of said leads.

5. The piezoelectric actuator of claim 1, in which the common electrode leads (3) are provided on two opposed sides of the actuator body (1).

6. A piezoelectric actuator for actuating control valves or injection valves in internal combustion engines in motor vehicles,
   having a piezoelectric actuator body (1), comprised of a multilayer laminate of layered plies of piezoelectric material including means for applying an electric field to said plies of piezoelectric material, and
   conductive common electrode leads (3), which connect to the means for supplying an electric field, wherein
   the actuator body (1) is surrounded by a metal module wall (2),
   an interstice (5) is provided between said module wall and said common electrode leads,
   the common electrode leads (3) are configured to increase heat transfer thereof and a portion of said common electrode leads contact the actuator body (1) and is provided as means for increasing a surface area thereof protruding into the interstice (5), for dissipating heat from the actuator body (1), and
   the interstice (5) is filled with elastomer (7, 17, 27), which contains heat-conducting means, and in which said means for increasing a surface area of said leads comprises a corrugated foil that is parallel to the side walls of the actuator body.

7. The piezoelectric actuator of claim 6, in which the foil forming the common electrode leads (3) in the interstice (5) is folded multiple times.

8. The piezoelectric actuator of claim 1, in which the lengthened portion (31, 32) of the common electrode leads (3) comprises a lengthening/enlargement of lead wires (12) that contact the common electrode leads.

9. The piezoelectric actuator of claim 8, in which each lengthened lead wire (12) in the interstice (5) is folded multiple times.

10. The piezoelectric actuator of claim 8, in which one lengthened portion (31, 32) of the common electrode leads (3), protruding into the interstice (5), of the common electrode leads (3) is contacted at multiple points along a length of the common electrode leads (3), with an extended portion of the lead wire (12) protruding into the interstice (5).

11. The piezoelectric actuator of claim 4, in which the common electrode leads (3) are each enlarged by a metal segment (9) that is located in the interstice (5) in a longitudinal direction of the actuator body.

12. The piezoelectric actuator of claim 11, in which each metal segment (9) is electrically insulated from an inside of the module wall (2) by an electric insulation layer (10).

13. The piezoelectric actuator of claim 12, in which each metal segment (9) is glued to the insulation layer (10) by an adhesive (111).

14. A piezoelectric actuator for actuating control valves or injection valves in internal combustion engines in motor vehicles, having a piezoelectric actuator body (1), comprised of a multilayer laminate of layered plies of piezoelectric material including means for applying an electric field to said plies of piezoelectric material, and conductive common electrode leads (3), which connect to the means for supplying an electric field, wherein the actuator body (1) is surrounded by a metal module wall (2), an interstice (5) is provided between said module wall and said common electrode leads, the common electrode leads (3) are configured to increase heat transfer thereof and a portion of said common electrode leads contact the actuator body (1) and is provided as means for increasing a surface area thereof protruding into the interstice (5), for dissipating heat from the actuator body (1), and the interstice (5) is filled with elastomer (7, 17, 27), which contains heat-conducting means, and in which the means for increasing a surface area of said leads (31, 32) of the common electrode leads (3) is formed by a metal wool or metal mesh (13).

15. The piezoelectric actuator of claim 1, in which the interstice (5) between the actuator body (1) and the module wall (2) is additionally filled with a heat-conducting elastomer (7, 27).

16. The piezoelectric actuator of claim 12, in which the inside of the module wall (2) is electrically insulated by an electrically insulating layer.

17. The piezoelectric actuator of claim 1, in which said heat-conducting elastomer includes means contained within it electrically conductive particles (17).

18. A piezoelectric actuator for actuating control valves or injection valves in internal combustion engines in motor vehicles, having a piezoelectric actuator body (1), comprised of a multilayer laminate of layered plies of piezoelectric material including means for applying an electric field to said plies of piezoelectric material, and conductive common electrode leads (3), which connect to the means for supplying an electric field, wherein the actuator body (1) is surrounded by a metal module wall (2), an interstice (5) is provided between said module wall and said common electrode leads, the common electrode leads (3) are configured to increase heat transfer thereof and a portion of said common electrode leads contact the actuator body (1) and is provided as means for increasing a surface area thereof protruding into the interstice (5), for dissipating heat from the actuator body (1), and the interstice (5) is filled with elastomer (7, 17, 27), which contains heat-conducting means, and in which said means for increasing a surface area of said leads comprises a corrugated band that is parallel to the side walls of the actuator body.

* * * * *